United States Patent [19]

Shambelan et al.

[11] 4,108,323

[45] Aug. 22, 1978

[54] MACHINE FOR CHANGING THE SPACING OF A PLURALITY OF WAFERS

[75] Inventors: Robert Charles Shambelan, Bridgewater; Charles Wesley Lindsley, Cresskill, both of N.J.

[73] Assignee: RCA Corporation, New York, N.Y.

[21] Appl. No.: 837,419

[22] Filed: Sep. 28, 1977

[51] Int. Cl.² ............................................. B65G 65/04
[52] U.S. Cl. .................................... 214/310; 214/1 R; 214/301
[58] Field of Search ...................... 214/16.6, 301, 309, 214/310, 1 R; 221/DIG. 1, 134; 211/135, 207, 208, 209; 53/152, 153, 166; 198/456, 458, 459

[56] References Cited

U.S. PATENT DOCUMENTS

| 3,920,128 | 11/1975 | Baker | 53/166 X |
| 3,949,891 | 4/1976 | Butler et al. | 214/301 |

Primary Examiner—Robert G. Sheridan
Attorney, Agent, or Firm—H. Christoffersen; D. S. Cohen; R. A. Hays

[57] ABSTRACT

A machine for changing the spacing of a plurality of wafers comprises a plurality of wafer receiving surfaces initially having a first spacing associated therewith. The wafer receiving surfaces cooperatively engage with means which, when activated, move the plurality of wafer receiving surfaces so that they have a second spacing associated therewith.

9 Claims, 3 Drawing Figures

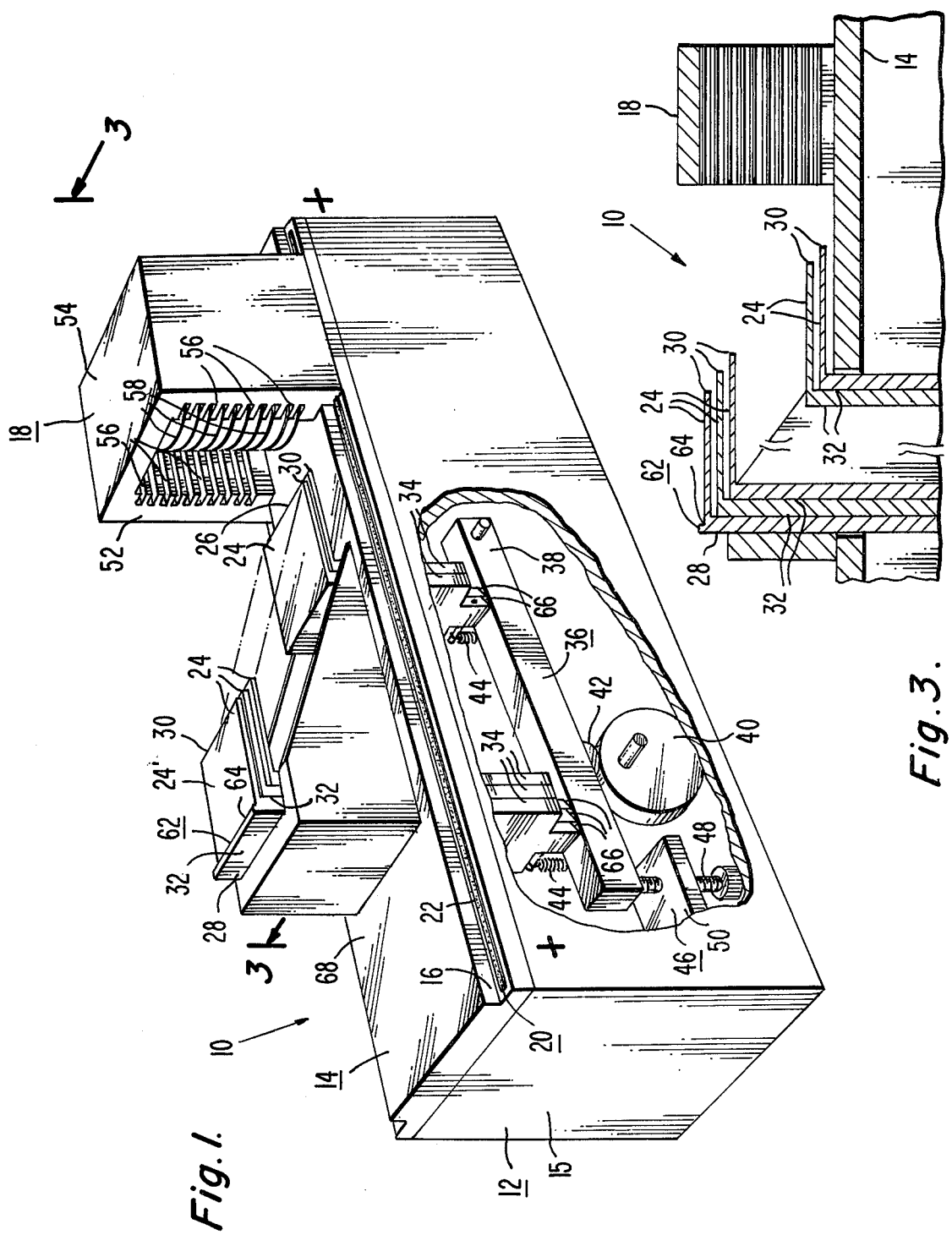

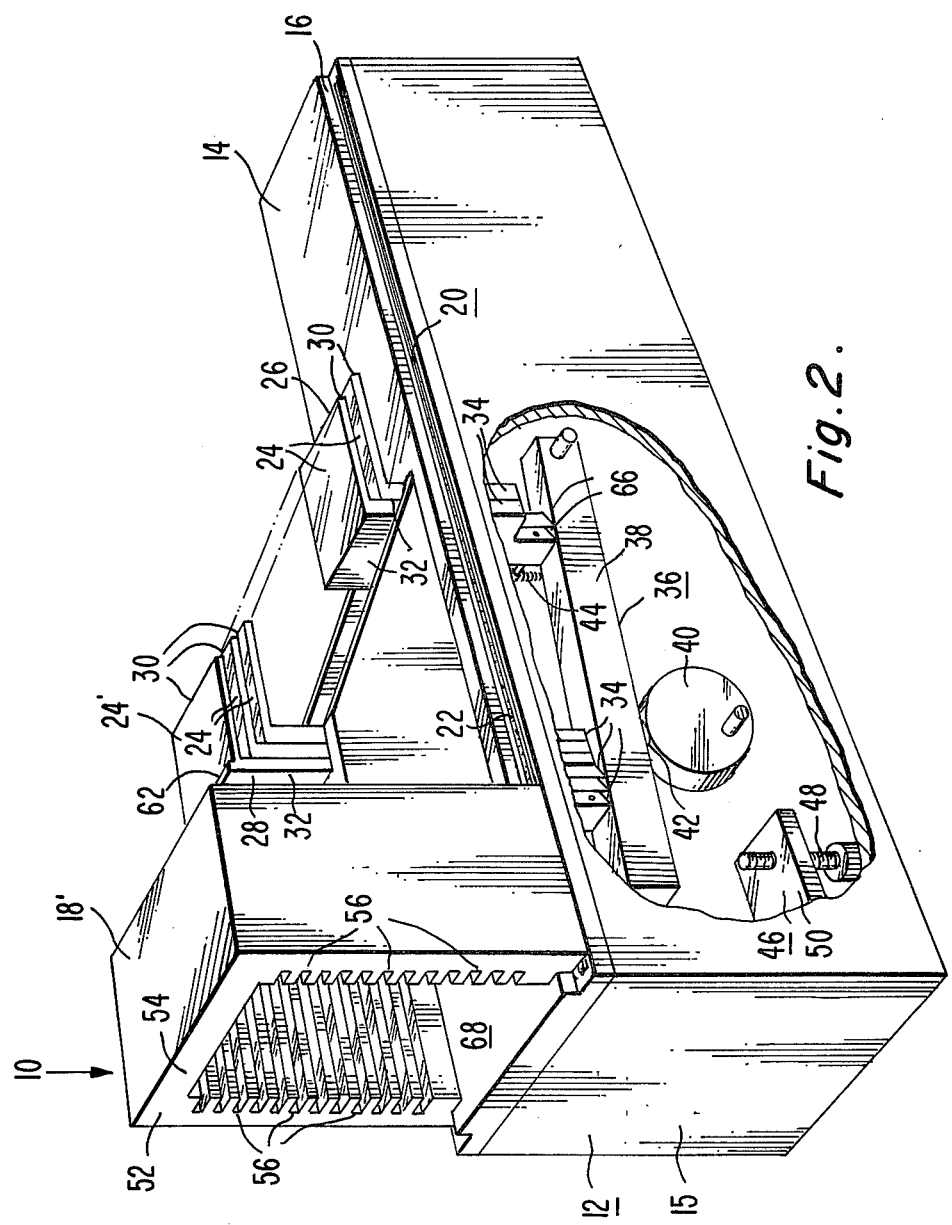

MACHINE FOR CHANGING THE SPACING OF A PLURALITY OF WAFERS

The present invention is generally directed toward machines used in the processing of wafers and, in particular, toward a machine which changes the pitch of a plurality of such wafers.

During the batch processing of wafers, for example semiconductor wafers, the wafers are generally subjected to a number of heating steps wherein the temperature thereof is raised to various levels and maintained at those levels for various periods of time. In addition, during such batch processing the wafers are also usually exposed to a plurality of chemcical steps such as etching, washing or the like, which are often performed at room temperature. In order to perform the heating steps in a most efficient manner, it is preferred that the wafers be closely packed while in the furnaces. During the chemical steps, on the other hand, it is preferred that the wafers be spaced further apart to insure uniform circulation of the particular chemical involved around the wafers. In view of these conditions and in order to fabricate wafers most effectively, the spacing of each batch of wafers is often changed during the processing, for example when going from a heating step to a chemical step, or vice-versa. Presently, this spacing change is performed by manually, i.e., using tweezers, removing each wafer from a cartridge having one spacing and inserting each into a cartridge having a different spacing. The use of such methods, i.e., picking up wafers with tweezers, usually scratches, breaks or otherwise damages the wafers whereby a number of the device pellets comrpising the wafer are destroyed. As a result, the pellet yield per wafer is reduced and the device cost is increased.

A machine embodying the principles of the present invention can be utilized to change the spacing of a plurality of wafers without any manual manipulating of the wafers.

In the drawing:

FIG. 1 is a pictorial view, partially cutaway, of a machine, not drawn to scale, embodying the principles of the present invention.

FIG. 2 is a pictorial view of the machine shown in FIG. 1 after the spacing has been changed.

FIG. 3 is a cross-sectional view of a portion of the machine shown in FIG. 1 taken along the line 3—3 thereof.

One embodiment of a machine, indicated generally at 10 in the drawing, embodying the principles of the present invention, comprises a base 12 having a top surface 14. The base 12 can be provided with bracing means 15 such as walls, legs, or the like to support the top surface 14. Alternatively, the base 12 can be adapted to fit into a cabinet or bench top. The machine 10 preferably has at least one guide rail 16, or the like, associated therewith which serves to position a wafer cartridge 18, more fully discussed below. Preferably there is a pair of parallel guide rails 16. The base 12 can further comprise transportation means 20 for moving the cartridge 18 along the top surface 14. The transportation means 20 can be any mechanism known in the art, for example a conveyor belt 22. Preferably the conveyor belt 22 is designed such that the cartridge 18 can be moved in both directions along the guide rails 16.

A plurality of wafer receiving surfaces 24 are positioned above the top surface 14. The wafer receiving surfaces 24 are located between the guide rails 16, such that the cartridge 18 can pass thereover. Each wafer receiving surface 24 is at a different height above the surface 14 and preferably the surfaces 24 are arranged in a single row according to height. That is, the lowest wafer receiving surface 24 is at one end 26 of the row while the highest wafer receiving surface 24' is at the other end 28. In the preferred embodiment the spacing between adjacent wafer receiving surfaces 24 is uniform, i.e., there is a spacing associated therewith. Each wafer receiving surface 24 has a front edge 30 and a back edge 32. The front edge 30 of each wafer receiving surface 24 is relatively nearer the one end 26 of the row than the corresponding back edge 32. Preferably to assist the wafer receiving surfaces 24 retain wafers thereon, the front edge 30 of each surface 24 is slightly higher, with respect to the top surface 14, than the back edge 32. Alternatively, the base 12 can be tilted to accomplish the same result.

Each wafer receiving surface 24 is positioned above the top surface 14 by a support 34, which can be a shank, a column or the like. Although the support 34 can be affixed to the wafer receiving surfaces 24 at any point, it is preferred, in this embodiment, that each support 34 be affixed to the back edge 32 of its corresponding wafer receiving surface 24. The support 34 is cooperatively engaged to a spacing control 36 which, when activated, either manually or automatically, moves the supports 34 in such a manner that the spacing associated with the wafer receiving surfaces 24 is changed.

While the spacing control means 36 can comprise known mechanical, electro-mechanical, hydraulic or like components, the means 36 of machine 10, as described hereinafter, is the preferred assembly. As shown in FIGS. 1 and 2, the spacing control means 36 includes a control arm 38 which is pivotally attached to the base 12 and contacted by the plurality of supports 34 which, in this case, extend through the top surface 14. The control arm 38 contacts an eccentric cam 40, which can be rotatably connected to the base 12. Thus, when the eccentric cam 40 is rotated, the control arm 38 pivots in response thereto. Preferably, in order to provide smooth movement of the control arm 38 a cam follower 42 is rotatably affixed to the control arm 38 and positioned so that it contacts the cam 40. It will be understood that the eccentric cam 40 can be connected to a motor (not shown) in order to mechanize the entire operation.

In order to insure that each support 34 closely follows the movement of the control arm 38, each is provided with a retaining means 44 for maintaining contact thereto. In this embodiment the retaining means 44 is a spring connected, in tension, between each support 34 and the control arm 38. Although other types of retaining means 44 can be used, the spring arrangement is preferred because it eliminates substantially all movement errors, particularly those usually introduced via the working tolerances of the various cooperative parts.

The machine 10 is preferably provided with an initial spacing adjustment means 46. In this embodiment, the initial spacing adjustment means 46 is a bolt 48 which is aligned with the control arm 38 and passes through a threaded mount 50 protruding from the base 12. Thus, the position of the control arm 38, which rests on the bolt 48, can be adjusted by rotating the bolt 48.

The discussion of the operation of the machine 10 is presented hereinafter. A wafer cartridge 18 is placed on the top surface 14 and aligned with the guide rails 16. The cartridge 18 has a pair of side walls 52 rigidly affixed to a top portion 54. The side walls 52 have a plurality of oppositely aligned grooves 56 which support a plurality of wafers 58. The grooves 56 are arranged such that there is a first spacing associated with the wafers 58 supported thereby. Preferably, the cartridge 18 prevents the ingress or egress of the wafers 58 through one end thereof. In one instance the ingress or egress of the wafers 58 are prevented from passing through one end by forming a narrower opening at that one end. The narrow opening is such that the cartridge 18 can pass over the surfaces 24 but wafers 58 cannot pass therethrough. The cartridge 18 is initially positioned such that the narrower end is closest to the one end 26 of the row of wafer receiving surfaces 24. The spacing of the wafer receiving surfaces 24 is adjusted, via the bolt 48 so that each surface 24 is substantially aligned with a wafer 58 in the cartridge 18. The cartridge 18 is then moved along the guide rails 16, either manually or automatically, over the row of wafer receiving surfaces 24. Ordinarily, each semiconductor wafer 58 has a generally circular periphery with at least one flat side therealong. In such a case it is preferred that all of the flat edges be aligned and face the wafer receiving surfaces 24.

In order to extract the wafers 58 from the cartridge 18 and retain them on the wafer receiving surfaces 24, each wafer receiving surface 24 has disengaging means 62 associated therewith. One form of a disengaging means 62 is a ridge 64 extending above the wafer receiving surface 24 which is of a sufficient height that only the wafer 58 which corresponds to that surface 24 is withdrawn from the cartridge and retained on that surface 24 as the cartridge 18 passes thereover. While each surface 24 can have a ridge 64 it is preferred, as shown in FIG. 3, that the supports 34 abut each other and the support 34 of each of the following surface 24 then serves as the disengaging means 62 for each of the immediately previous surface 24, except, of course, for the highest surface 24 which has a ridge 64. This configuration places the plurality of surfaces 24 in an overlapping relationship and thus reduces the size of the overall machine 10. In the preferred embodiment the disengaging means 62 contacts only the flat edges of the wafers 58.

After the wafers 58 are distributed on the surfaces 24 the spacing control means 36 is activated. In this example the eccentric cam 40 is rotated, either manually or automatically, the desired amount to effect the preselected spacing change by rotating the control arm 38 through a preselected angle. The amount of rotation is determined by the spacing desired, i.e., the vertical movement of the surfaces 24 is dependent upon the sine of the angle through which the control arm 38 is rotated. In the preferred embodiment wherein the supports 34 of adjacent surfaces 24 abut each other, it is advantageous that each support 34 contact the control arm 38 with a knife edge 66. The use of the knife edge 66 avoids unnecessary binding and frictional forces between the abutting supports 34. That is, if the supports 34 contacted the control arm 38 with a blunt face there would tend to be considerable lateral and rotational force vectors applied to the supports 34 during the rotation of the control arm 38, rather than only a substantially vertical force vector. In addition, if the supports 34 contact the control arm 38 with a flat edge the point of contact therebetween can vary for any given rotation. That is, the contact can shift from one edge of the supports 34 to another edge of the support 34 during the rotation of the control arm 38. Such a shift can introduce considerable errors and result in poor spacing control. It will be understood that the eccentric cam 40, or its counterpart in similar machines, can be designed and shaped to provide almost any spacing change desired.

After the spacing of the wafer receiving surfaces 24 has been changed, a second cartridge 18' having a spacing about equal to the spacing of the surfaces 24 after rotation, is placed on the top surface 14 behind the back edges 32 of the surfaces 24 and aligned with the guide rails 16. A re-entry platform 68 can be provided for this positioning and alignment step. The second cartridge 18' is then moved over the surfaces 24, picking up the wafers 58 as it passes thereover. The dislodgement and pick up of the wafers 58 is effected by the presence of the narrower end for preventing ingress and egress of the second wafer cartridge 18'.

A machine embodying the principles of the present invention is utilized a number of times during the fabrication of a given batch of wafers. A machine as described herein not only saves time but also reduces the amount of manual participation in the fabrication steps and thus improves the pellet per wafer yield of the overall process.

What is claimed is:
1. A machine comprising:
 a plurality of wafer receiving surfaces, said wafer receiving surfaces initially having a first spacing associated therewith;
 a base having a top surface above which said wafer receiving surfaces extend,
 each said wafer receiving surface being at a different height above said top surface than every other wafer receiving surface; and
 means cooperatively engaged with said surfaces for changing said first spacing to a second spacing.
2. A machine as claimed in claim 1 wherein each said wafer receiving surface further comprises:
 means for disengaging a wafer from a wafer cartridge.
3. A machine as claimed in claim 2 wherein:
 said disengaging means is a ridge projecting from a back edge of each of said wafer receiving surface.
4. A machine as claimed in claim 1 wherein:
 said wafer receiving surfaces are aligned in a single row according to height.
5. A machine as claimed in claim 4 wherein:
 said wafer receiving surfaces are positioned in an overlapping fashion.
6. A machine as claimed in claim 1 wherein:
 each wafer receiving surface is supported by a shank which movably contacts said space changing means.
7. A machine as claimed in claim 6 wherein said space changing means comprises:
 a control arm pivotally connected to a base having a top surface above which said wafer receiving surfaces extend; said control arm being contacted by said shanks; and
 an eccentric cam rotatably engaged with said base and contacting said control arm whereby said control arm pivots when said cam is rotated.
8. A machine as claimed in claim 7 further comprising:
 means for securing contact between said shanks and said control arm.
9. A machine as claimed in claim 1 further comprising:
 means for adjusting said first spacing.

* * * * *